(12) United States Patent
Iseler et al.

(10) Patent No.: US 6,849,121 B1
(45) Date of Patent: Feb. 1, 2005

(54) GROWTH OF UNIFORM CRYSTALS

(75) Inventors: Gerald W. Iseler, Chelmsford, MA (US); David F. Bliss, Arlington, MA (US); Vladimir L. Tassev, Wakefield, MA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 3 days.

(21) Appl. No.: 10/131,458

(22) Filed: Apr. 23, 2002

Related U.S. Application Data

(60) Provisional application No. 60/285,914, filed on Apr. 24, 2001.

(51) Int. Cl.$^7$ ............................................... C30B 11/00
(52) U.S. Cl. ....................................................... 117/81
(58) Field of Search .............................. 117/11, 73, 74, 117/81, 83; 164/122

(56) References Cited

U.S. PATENT DOCUMENTS 5,253,696 A * 10/1993 Misra ........................... 164/48

OTHER PUBLICATIONS

Hurle, ed., Handbook of Crystal Growth 2 Bulk Crystal Growth Part A: Basic Techniques, North–Holland, Amsterdam, Chapter 5, pp. 261–285, 1994.*
Kim, Suppression of Thermal Convection by Transverse Magnetic Field, Journal of Electrochemical Society, 129 (1982), pp. 427–429 ☐ ☐.*
Sen et al., Influence of Magnetic Field on Vertical Bridgman–Stockbarger Growth of InGaSb, Journal of Crystal Growth, 43 (1978), pp. 526–530 ☐ ☐.*
Matthiesen, et al., Dopant Segregation during Vertical Bridgman–Stockbarger Growth with Melt Stabilization by Strong Axial Magnetic Fields, Journal of Crystal Growth, 85 (1987), pp. 557–560.*

* cited by examiner

*Primary Examiner*—Nadine G. Norton
*Assistant Examiner*—Matthew A. Anderson
(74) *Attorney, Agent, or Firm*—Thomas C. Stover

(57) ABSTRACT

The invention provides for growing semiconductor and other crystals by loading a vessel in its lower portion with a seed crystal, loading a charge thereon in the vessel, heating the charge to a molten state and electromagnetically stirring the melt using magnetic and electric fields to obtain a more uniform composition of melt and slowly reducing the temperature of the melt over the crystal to grow a more uniform crystal from such stirred melt.

10 Claims, 6 Drawing Sheets

GROWTH OF UNIFORM CRYSTALS

RELATED APPLICATIONS

This application relates to provisional application 60/285,914, filed 24 Apr. 01, from which domestic priority is claimed.

STATEMENT OF GOVERNMENT INTEREST

The invention described herein may be manufactured and used by or for the Government for governmental purposes without the payment of any royalty thereon.

FIELD OF THE INVENTION

This invention relates to controlled growth of crystals, particularly for growth of more uniform crystals.

BACKGROUND OF THE INVENTION

The favored research approach to achieve ultra high-quality compound semiconductor crystals is the bottom-seeded method—either the Vertical Gradient Freeze (VGF) or Bridgman technique. There are clear advantages of these methods over the more common top-seeded Czochralski (CZ) method, However, in some cases the crystal growth rate can be severely limited and in others the composition of the crystal can be non-uniform.

In the above bottom-seeded method, seed crystal 2 is positioned under growth crystal 4, in turn under melt 6, in vessel 8 as shown in FIG. 1.

In the VGF and Bridgman methods of crystal growth (FIG. 1), solidification is initiated either from a seed or from spontaneous nuclei at the bottom of a molten charge as opposed to the CZ method in which a seed is dipped into the melt from the top. Convective stirring due to thermally driven buoyancy, that is found in CZ melts, is not present in bottom-seeded melts, where the thermal gradient increasing from the bottom to the top of the melt provides thermal stability. This absence of strong convection, in fact, provides some of the advantages of the bottom-seeded methods over the CZ method (fewer dislocations and lower twinning probability). However, the absence of melt convection also generates the melt condition that limits the growth rate and causes compositional non-uniformity.

Generally the chemical composition of a solid is not precisely the same as that of the melt from which it freezes. This is known as non-congruent melting, as opposed to congruent melting, in which the composition of the solid and liquid phases are identical. For alloy crystals such as $Ga_{1-x}Al_xSb$, for example, the solid composition can be very different from that of the melt. Therefore during solidification one, or more of the constituent elements is rejected into the melt to form a boundary layer of liquid with a chemical make-up that is different from that of the bulk of the melt. This boundary layer builds up just adjacent to the crystal-melt interface. Strong convective stirring due to thermally driven buoyancy, is not present in bottom-seeded melts because the top is hotter than the bottom. Therefore the most effective transport mechanism in the boundary layer of a VGF melt is diffusion, which tends to be quite slow. This slow rate of diffusion determines the crystal growth rate limit. Typical growth rates for bottom-seeded melts are nearly an order of magnitude less than those for top-seeded CZ growth and therefore the cost of producing VGF crystals is greater. In addition, if there is virtually no mixing in the melt, the composition of the grown crystal can exhibit radial non-uniformity if the melt composition is not initially uniform from the center to the periphery.

Accordingly there is need and market for an improved growth process for the above alloy crystals that overcomes the above prior art shortcomings.

There has now been discovered a process for more controlled crystal growth to obtain more uniform crystals; both alloy crystals and non-congruently melting binary crystals.

SUMMARY OF THE INVENTION

Broadly, the present invention provides a method for growing a more uniform crystal by bottom seeding which includes, a) loading a vessel, in its lower portion with a seed crystal, b) adding a charge thereon in said vessel, c) heating the charge to a molten state to form a melt, d) electromagnetically stirring the melt to promote uniformity over the crystal and e) slowly reducing the temperature of the melt over such crystal to grow the latter.

The invention also provides more uniform crystals as grown by the above process;

Examples of crystal growth methods with electromagnetic stirring are found in the prior art, e.g., in U.S. Pat. No. 5,769,944 to Park et al (1998) and in a Paper entitled *Silicon Crystal Growth by the Electromagnetic Czochralski (EMCZ) Method*, Jpn. J. Appl. Phys. Vol. 38 (1999) pp. L10–L13, by M. Watanabe et al. which, however, relate to the CZ or top seeding method of crystal growth, with the attendant problems of non-uniform composition and higher defect density due to convection and the steep temperature gradient. Thus the prior art above does not provide for forming a uniform alloy crystal.

Definitions:

By "precursor charge", as used herein, is meant a charge that can be heated to a melt that can grow, upon cooling, into a crystal of desired composition By "crystal", as used herein, is meant a sizeable (up to 2-inch diameter or more) solid body, with the same crystallographic structure and orientation.

By "slowly reducing the temperature of the melt", as used herein, is meant to decrease linearly with time the temperature of the liquid above the growing crystal by reducing the heat emanating from various heaters.

By "vessel", as used herein, is meant a container, a crucible of carbon, of quartz, of boron nitride or any other material that will not react with the melt.

By "alloy", as used herein, is meant a mixture or combination of two or more constituents in a crystal whose melting temperature and crystallographic properties are determined by its composition.

By "dopant", as used herein, is meant an additional minor element mixed with the major constituents, which alters some crystal properties, but does not significantly alter the melting temperature.

By "uniform", as used herein, is meant having a constant composition (alloy or dopant) throughout the crystal body or nearly so.

BRIEF DESCRIPTION OF THE DRAWINGS

The invention will become more apparent from the following detailed specification and drawings in which.

DESCRIPTION OF PREFERRED EMBODIMENTS

Figure 1:
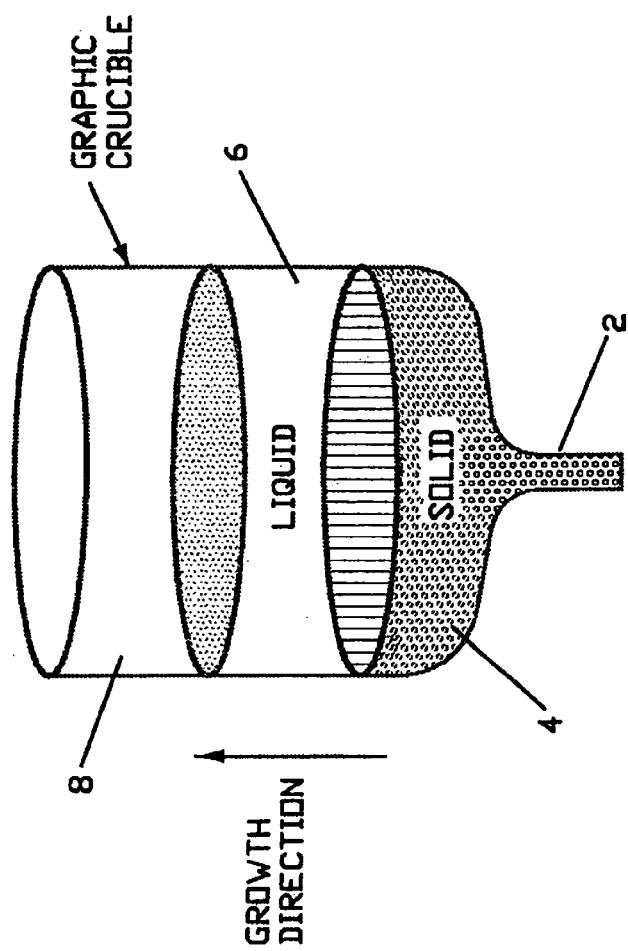
FIG. 1 is a perspective, schematic view of a vessel for un-enhanced crystal growth per the prior art.
Figure 2:
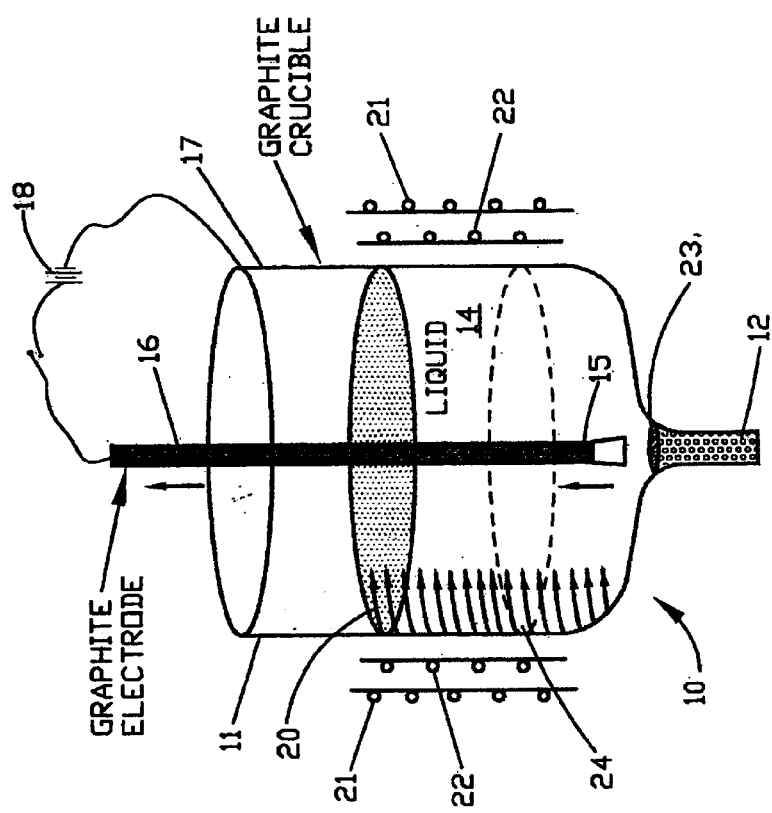
FIG. 2 is a perspective schematic view of an embodiment for enhanced crystal growth per the present invention.

Referring in more detail to the drawings, the present invention utilizes magnetic and electric fields to provide stirring during the growth of semiconductor crystals from bottom-seeded melts. One procedure for growing a crystal with such stirring, is to load a cylindrical crystal growth crucible 11 that is closed at the bottom and open at the top with a single seed crystal 12 at the bottom and a charge of one or more chunks or particles of a solid (at room temperature) on top of it (not shown). The so loaded crucible is then heated by a helical coil 22, so that the temperature increases from bottom to top of the charge, until all of the charge and a small portion of the seed 12, become molten to form melt 14, as indicated in FIG. 2.

Figure 3:
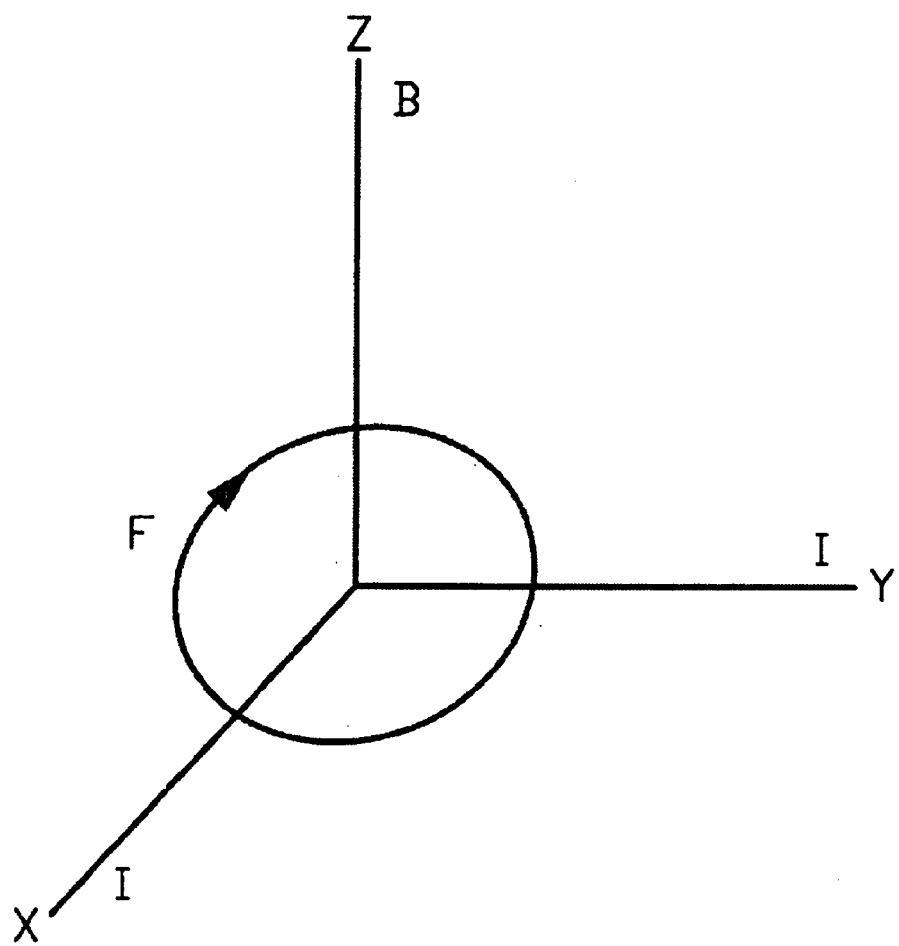
FIG. 3 is an isometric vector diagram relative to FIG. 2.

A small-diameter electrode 16 made of electrically conducting material that does not chemically react with the molten charge is inserted vertically into the center of the melt so that it extends to a point just above the seed crystal 12 but does not touch it. If the crucible is electrically conducting, it serves as the second electrode 17 and a voltage source 18 is connected between the two. In this case, if the melt 14 is a good conductor, an electric current will flow radially from (or to) the center electrode 16. A magnetic field B (per FIG. 3) is induced in the melt in the vertical direction by a magnetic coil or solenoid 21, as indicated in FIG. 2. The magnetic field B, perpendicular to the current I, will induce a tangential force F (per FIG. 3) and under many conditions, create a tangential flow 20 (per FIG. 2) and cause mixing in the melt.

Alternatively the coil 22 can be the same one that serves as a heat source around the vessel. A magnetic field of about 50 gauss generated directly with a heating coil together with a current of several tens of amperes can be sufficient.

In one example, it has been demonstrated that for a two inch diameter melt of GaSb, about 5 amperes of current together with a magnetic field of 50 gauss produce melt rotation rates of about 15 RPM.

To grow the crystal, the temperature is slowly reduced so that the melt is progressively crystallized onto the seed. As the height of the crystal interface 23 increases, the electrode 16 is growth interface, e.g., 23 to 24, by utilizing an electrical insulator 15 over the upper length of the center electrode, per FIG. 2.

Figure 4:
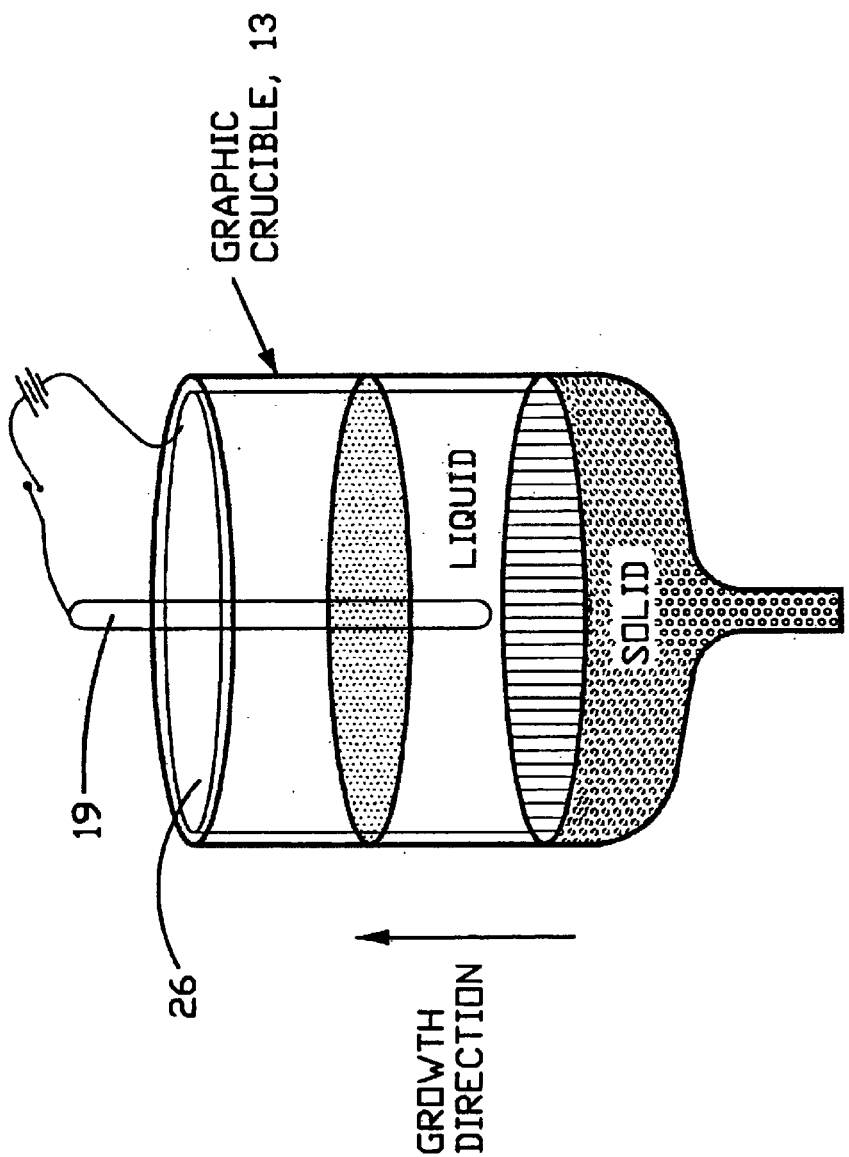
FIG. 4 is a perspective schematic view of another embodiment of the invention and FIGS. 5 & 6 are elevation schematic views, partly in section, of yet another embodiment of the invention for enhanced crystal growth.

Also per FIG. 4, if the crucible 13 is not electrically conducting, a thin-walled cylinder 26 of conducting material or one, two or more small diameter electrodes (not shown, but similar in size to electrode 19 in FIG. 4) near the periphery of the melt can be deployed within the vessel. If the melt is volatile, an inert encapsulant can be employed and the growth takes place in a high-pressure chamber (not shown).

Figure 5:
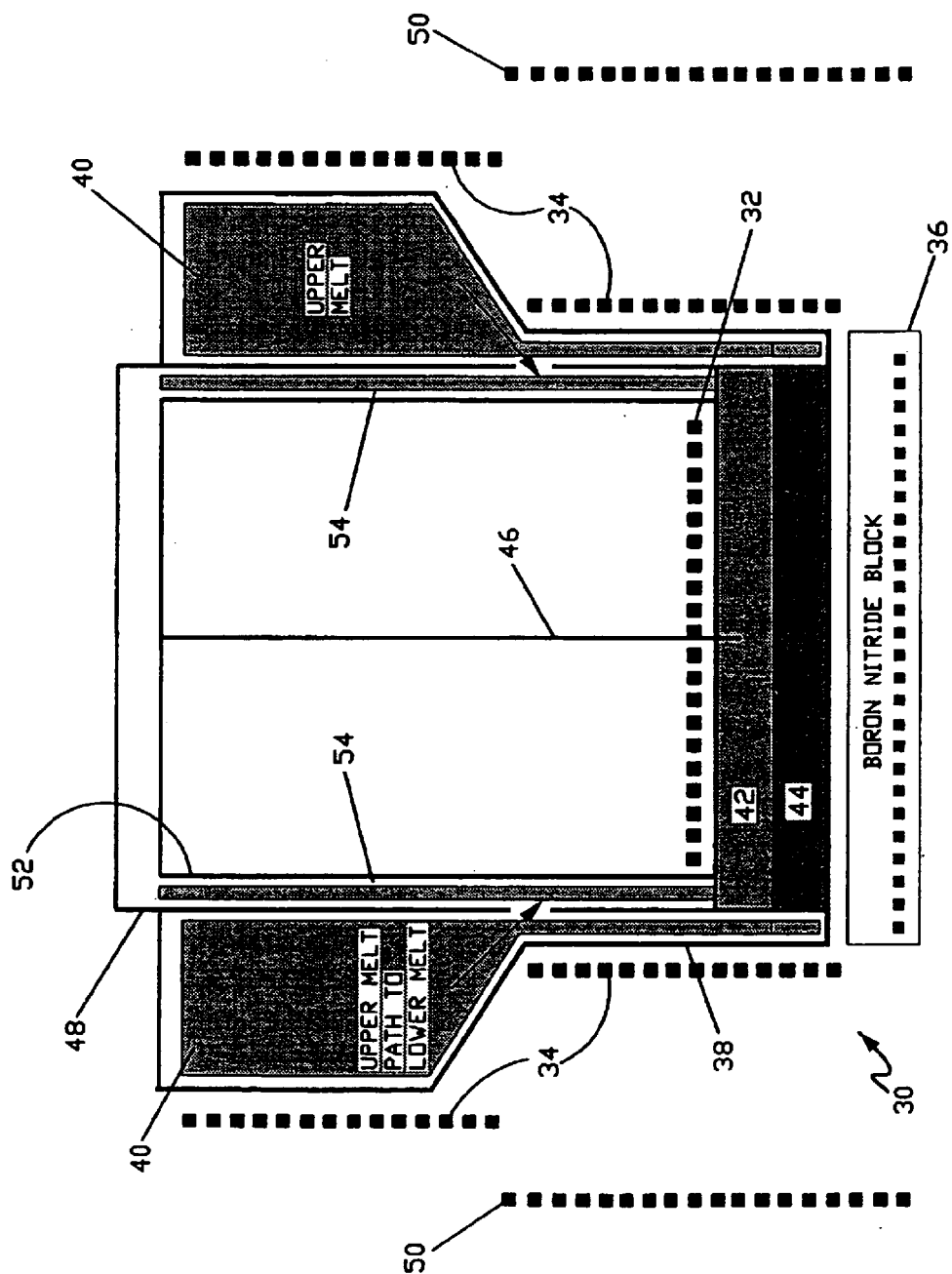
Figure 6:
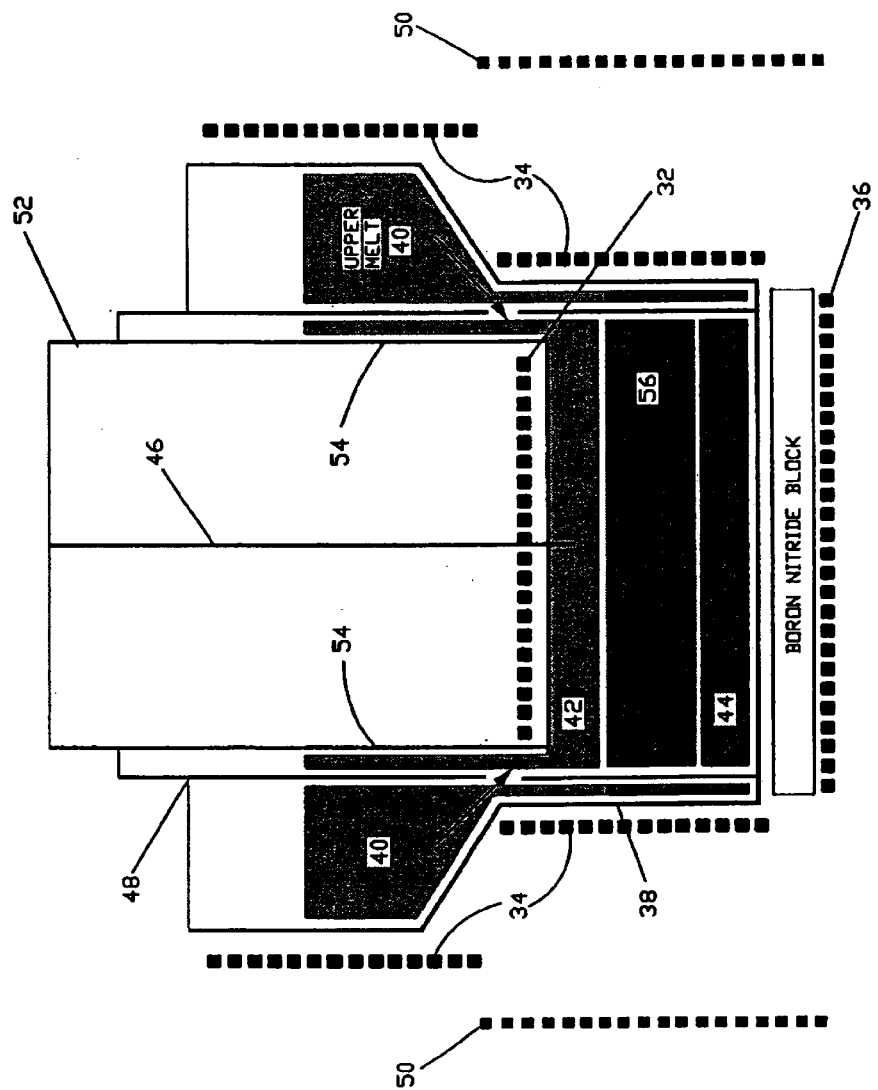

Electromagnetic stirring can also be employed to improve the quality and increase the growth rate of crystals grown by a bottom-seeded technique in which a submerged heater 32, in vessel 30, per FIGS. 5 & 6, is employed to promote good long-range chemical uniformity. A schematic cross-sectional elevation of the crystal growth apparatus 30 is shown in FIGS. 5 & 6. The submerged heater 32, in its housing 52, effectively isolates two melt zones (upper and lower) during growth, to provide a constant alloy composition in the lower zone and thus also in the crystal to be formed. The system utilizes coil (34) and planar resistance heating elements (36) as shown. A fused silica crucible 38 contains a large-diameter hollow-core upper charge to supply melt 40 and a smaller diameter lower charge to supply melt 42 as well as a full-diameter seed crystal 44. The graphite electrodes (including the small diameter electrode 46 in the center, and the outer electrode 48 surrounding the growing crystal) are used to pass the radial current which stirs the lower melt 42 when a vertical magnetic field is also applied in the manner of FIGS. 2 & 3 above. As shown in FIG. 5, a copper wire coil 50, wrapped on the outside of a lower insulating tube (not shown) provides the magnetic field. At the beginning of a growth run, the upper and lower charges are made molten or melts 40 & 42, by applying power to the heaters; i.e., the coil "side heaters" 34, the "submerged heater 32", and the "external lower heater 36". A small fraction of the seed 44 is also melted just prior to growth. To grow the crystal, the temperature of the BN disc 36, just below the seed 44, is ramped down with a temperature controller (not shown) connected to the external lower heater. At the same time, the submerged heater housing 52 is slowly raised, and the temperatures of the side heaters are ramped down as well. As the crystal grows, per FIG. 6, molten material flows from the upper melt 40 to the lower one 42, through small holes in the outer electrode tube and down through the annular space between the outer electrode 48 and the submerged heater housing 52, as indicated in FIGS. 5 & 6. The aim is to maintain a constant lower melt height of the order of, e.g., 1 cm while the crystal grows upwardly from the seed. A drawing of the system after some growth of crystal 56 has taken place, is shown in FIG. 6. Since the lower melt 42 is replenished with liquid from the upper melt 40 through the annular space 54, if there were no mixing, the liquid composition of the annulus 54 could be quite different from that of the remainder of the lower melt 42. In this case, stirring the molten melt 42 below the submerged heater 32 with electric and magnetic fields can provide a more uniform radial composition both in the melt 42 and in the crystal 56, in addition to permitting a more rapid growth rate.

Thus the present invention employs magnetic and electric fields to provide stirring during crystal growth where uniform composition and homogeneous properties are required. The lack of stirring is a chronic problem for crystals that are grown from bottom-seeded melts. In the present invention, the melt is mixed by the Lorenz force arising when an axial magnetic field is applied together with a radial electric current. This novel technique is applied to solve a chronic problem associated with many semiconductor crystals and alloy crystals, which can be of great importance militarily or commercially. The problem has been that, in commercial practice, low defect density crystals can only be obtained by bottom-seeded methods, but these methods are very slow and lacking in uniformity of crystal properties. The bottom-seeded method of the present invention overcomes the above disadvantages and there is a need for crystals with low defect density and uniform properties such as GaSb for IR transparent windows for IR imaging arrays. Such crystals do not exist at present. The method of the present invention offers the following advantages:

1. Faster growth rates
2. Controlled crystal properties
3. Uniform alloy composition and doping concentration The advantages of the electromagnetic stirring of bottom-seeded crystal growth melts are realized through the changes that stirring creates in the boundary layer above the growing crystal. Since the crystal is frozen from the liquid in this layer, its radial uniformity depends directly on the chemical uniformity of such layer, and stirring can improve it.

A value of this invention militarily is that new high-quality crystal substrates will become available for high-speed photonics and advanced micro-electronic circuits. Prior to this invention, the majority of semiconductor crystals have been produced commercially by top seeded growth methods, which have typically high defect densities and are not suitable for advanced applications such as long wavelength IR lasers and detector arrays.

A benefit of this invention is to improve the quality and reduce the cost of compound melt-grown bulk semiconductor crystals by electromagnetic stirring. Such crystals are generally sliced into wafers and used as substrates for epitaxial growth or for ion implantation. These crystal wafers are the building blocks for structures that enable the fabrication of virtually every electronic and optical system being produced or in development.

The type of crystals grown herein include crystals of alloy crystals such as $Ga_{1-x}Al_xSb$, or $In_{1-x}Ga_xP$, for example or any combination of mixed Group III and Group V elements of the periodic table. In general, any incongruently melting crystal material can be grown by this method.

What is claimed is:

1. A process for growing a more uniform crystal by bottom seeding comprising,
    a) loading a vessel in its lower portion with a seed crystal,
    b) adding a precursor charge thereon in said vessel,
    c) heating said charge to a molten state, to form a melt,
    d) electromagnetically stirring said melt to form a more uniform composition melt over said seed crystal and
    e) slowly reducing the temperature of said melt over said seed to grow said crystal.

2. The process of claim 1 wherein a vertical magnetic field is induced in said vessel and an electric field is applied orthogonally to said magnetic field in such a manner that a rotational stirring of the melt results.

3. A process for growing a more uniform crystal by bottom seeding comprising.
    a) loading a vessel in its lower portion with a seed crystal; said vessel having electrically conductive walls or if not, an annular sleeve that closely fits within said walls, which sleeve is conductive to define an outer electrode,
    b) loading a charge on said seed crystal within said vessel,
    c) mounting an elongated inner electrode centrally, or nearly so, within said outer electrode, so it extends to said charge but does not contact said crystal,
    d) positioning an inductance coil around said vessel,
    e) heating the so loaded charge to a molten state or melt,
    f) applying a voltage across said two electrodes so as to impose an electric current in said melt and
    g) applying a voltage across said coil to induce a magnetic field in said melt to produce a stirring force therein to improve the uniformity of melt and crystal.

4. The process of claim 3 wherein the vessel and its contents are heated in such a manner that the temperature of said charge increases from bottom to top of said charge so that all of the melt and a small portion of the seed become molten.

5. The process of claim 3 wherein said inductance coil also serves to heat said charge to said molten state, which coil also serves to generate said magnetic field and stirring forces in said melt.

6. The process of claim 3 wherein the temperature of melt in the vessel is slowly reduced to grow said crystal at the melt-crystal interface.

7. The process of claim 6 wherein said elongated electrode is raised in advance of the rising crystal growth in said vessel.

8. The process of claim 3 wherein when said vessel is not electrically conducting, a thin wall cylinder of conducting material or one or more small diameter electrodes can be placed in the vessel near the periphery of the melt.

9. A process for rowing a more uniform crystal by bottom seeding comprising.
    a) loading a vessel in its lower portion with a seed crystal, said vessel having electrically conductive walls or if not, an annular sleeve that closely fits within said walls, which sleeve is conductive, to define an outer electrode,
    b) loading a lower charge on said seed crystal within said vessel to supply a lower melt,
    c) lowering an inner heater in a heater housing in said vessel, onto said lower charge, which heater housing is sized to leave one or more annular spaces between it and the vessel interior walls,
    d) mounting an elongated inner electrode centrally, or nearly so, within said outer electrode, so it extends through said heater housing and into said charge but does not contact said seed crystal,
    e) loading an upper charge into an upper reservoir of said vessel to supply an upper melt where it can flow down through said annular spaces and around said heater housing to contact said lower melt and thus submerge a portion of said housing in said melt,
    f) applying heat from the sides and from below said vessel and said seed crystal and from the inner heater above the melt, to render said upper and lower charges molten, to form said upper and lower melts and to render a portion of said seed crystal molten proximate said lower melt,
    g) positioning a solenoid around said vessel,
    h) applying a voltage across said two electrodes so as to impose an electric current in said lower melt and
    i) applying a voltage across said solenoid to induce a magnetic field in said melt to produce a stirring force therein to improve the uniformity of melt and crystal.

10. The process of claim 9 further comprising,
    j) ramping down the temperature below said vessel and seed crystal and slowly raising said inner heater and its heater housing in advance of crystal growth below, in the bestirred lower melt, to provide a more uniform radial composition both in said melt and crystal while
    k) replenishing said lower melt from the upper reservoir melt through said annular spaces.

* * * * *